US 6,414,872 B1

(12) United States Patent
Bergemont et al.

(10) Patent No.: US 6,414,872 B1
(45) Date of Patent: Jul. 2, 2002

(54) COMPACT NON-VOLATILE MEMORY DEVICE AND MEMORY ARRAY

(75) Inventors: Albert Bergemont, Palo Alto; Pascale Francis, Cupertino, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/598,929

(22) Filed: Jun. 21, 2000

(51) Int. Cl.[7] .............................................. G11C 16/04
(52) U.S. Cl. ................... 365/185.05; 257/315
(58) Field of Search ..................... 365/185.05; 257/315, 257/316, 317

(56) References Cited

U.S. PATENT DOCUMENTS

| 4,822,750 A | * | 4/1989 | Perlegos et al. ............... 437/52 |
| 5,761,126 A | | 6/1998 | Chi et al. ............... 365/185.27 |
| 5,940,324 A | | 8/1999 | Chi et al. ............... 365/185.27 |
| 5,998,267 A | | 12/1999 | Bergemont et al. .......... 438/270 |
| 6,055,185 A | | 4/2000 | Kalnitsky et al. ....... 365/185.18 |
| 6,125,700 A1 | * | 4/2001 | Fong et al. ............ 365/185.01 |
| 6,232,631 B1 | * | 5/2001 | Schmidt et al. ............. 257/315 |

OTHER PUBLICATIONS

Albert Bergemont et al., "A Non–Volatile Memory Device With True CMOS Compatibilty", Electronics Letters, vol. 35, No. 17, 1443–1445 (Aug. 19, 1999).

* cited by examiner

Primary Examiner—Vu A. Le
(74) Attorney, Agent, or Firm—Pillsbury Winthrop LLP

(57) ABSTRACT

A compact non-volatile memory device and memory array that are compatible with conventional MOS device processing. The compact non-volatile memory device includes a PMOS storage transistor with a floating gate in series with a PMOS access transistor. Since both of these PMOS transistors can be disposed in a single N-type well region, the size of the compact non-volatile memory device is relatively small. Another MOS processing compatible compact non-volatile memory device is formed in a semiconductor substrate of a first conductivity type (typically P-type) that includes a well region of a second conductivity type (typically N-type). Such a device also includes first source and drain regions of the first conductivity type, a first channel region defined therebetween, and a floating gate. This device also includes second source and drain regions of the first conductivity type, a second channel region defined therebetween, and a gate. The first and second source and drain regions and first and second channel regions are formed in the well region. The compact non-volatile memory array includes a plurality of traversing bit and word lines and a plurality of the compact non-volatile memory devices. Each compact non-volatile memory device includes a PMOS storage transistor with a floating gate and a serially connected PMOS access transistor. In addition, each compact non-volatile memory device is electrically connected to a bit line via the PMOS storage transistor's source and electrically connected to a word lines via the PMOS access transistor's gate.

20 Claims, 3 Drawing Sheets

COMPACT NON-VOLATILE MEMORY DEVICE AND MEMORY ARRAY

BACKGROUND OF THE INVENTION

1. Field of the Invention

The present invention relates to semiconductor devices, in particular, to non-volatile memory devices.

2. Description of the Related Art

In Application Specific Integrated Circuits (ASICs), it is often desirable to incorporate a low-cost, low-density, non-volatile memory device or memory array. However, process complexity hinders the incorporation of traditional non-volatile memory devices and memory arrays (e.g., traditional electrically-programmable read-only memory [EPROM] devices) into Metal-Oxide-Semiconductor (MOS) ASICs. The need for multiple polysilicon layers, various gate silicon dioxide ($SiO_2$) thicknesses, and/or non-standard junction doping profiles in traditional non-volatile memory devices, for example, increases process complexity and cost.

To overcome these drawbacks, a non-volatile memory device 10 that utilizes standard CMOS transistors has been proposed, as illustrated in FIG. 1. This conventional non-volatile memory device 10 includes a PMOS transistor 12 configured in series with an NMOS access transistor 14.

In PMOS transistor 12, no electrical contact is made to the polysilicon gate 16, which therefore acts as a "polysilicon floating gate". Because the polysilicon gate 16 of the PMOS transistor is a polysilicon floating gate, PMOS transistor 12 can function as a storage device and is alternatively referred to as a "PMOS storage transistor" 12. The source 18 of the PMOS storage transistor 12 is configured to be electrically connected to $V_{SS}$ (a negative power supply terminal), or ground (GND), and to $V_{CC}$ (a power supply terminal, also commonly referred to as $V_{DD}$) during programming and reading of the conventional non-volatile memory device 10.

NMOS access transistor 14 has a polysilicon gate 20 that is also configured to be electrically connected to both $V_{SS}$ and $V_{CC}$ during programming and reading of the conventional non-volatile memory device 10. NMOS access transistor 14 also includes a drain 22 that is electrically connected to $V_{SS}$ (a negative power supply terminal) or ground (GND). The NMOS access transistor 14 is, therefore, configured to provide for the selective programming of the PMOS storage transistor 12. A further discussion of conventional non-volatile memory device 10 and its operation is available in Albert Bergemont et al., *A Non-Volatile Memory Device with True CMOS Compatibility*, Electronics Letter, Vol. 35, no. 17. 1443–5 (IEE, Aug. 19, 1999), which is hereby fully incorporated by reference.

FIG. 2 is a plan view of a layout for a conventional non-volatile memory device 40 that is essentially equivalent to the electrical schematic of FIG. 1. As shown in FIG. 2, this conventional non-volatile memory device 40 includes a PMOS transistor 42 (i.e., a PMOS "storage" transistor 42) that includes a P-type source region 44 and a P-type drain region 46, which are spaced apart from each other. The P-type source region 44 and the P-type drain region are formed in an N-type well region 48, and a channel region 50 is defined between the P-type source region 44 and the P-type drain region 46. PMOS storage transistor 42 also includes a polysilicon floating gate 52.

Conventional non-volatile memory device 40 also includes an NMOS access transistor 54 with a N-type source region 56 and a N-type drain region 58, which are spaced apart from each other. The N-type source region 56 and N-type drain region 58 are formed in a P-type semiconductor material (e.g., a P-type well region or P-type wafer substrate), and a channel region 62 is defined between the N-type source region 56 and the N-type drain region 58. NMOS access transistor 54 also includes a polysilicon gate 64.

In the conventional non-volatile memory device 40 of FIG. 2, the N-type source region 56 of the NMOS access transistor 54 is electrically connected to the P-type drain region 46 of the PMOS storage transistor 42 via a metal interconnect line 66 (commonly referred to as a metal "strap"). Furthermore, a contact 67 is provided to electrically connect the N-type drain region 58 to GND/$V_{SS}$, a contact 68 is provided to electrically connect the polysilicon gate 64 to $V_{CC}/V_{SS}$, a contact 70 is provided to electrically connect the P-type source region 44 to $V_{CC}/V_{SS}$ and a contact 71 is provided to electrically connect the N-type well region 48 to $V_{CC}/V_{SS}$.

Conventional non-volatile memory device 40 can also be represented in a combined cross-sectional and schematic manner as depicted in FIG. 3, wherein like reference numerals from FIG. 2 are used to refer to like elements. In FIG. 3, the conventional non-volatile memory device 40 is formed in a P-type semiconductor material (e.g., a P-type well region or a P-type wafer substrate) 72. The conventional non-volatile memory device 40 includes an N-type well region 48 disposed in the P-type semiconductor material 72 and electrically connected to $V_{CC}/V_{SS}$ via N-type contact region 74.

The PMOS storage transistor 42 includes spaced-apart P-type source and drain regions 44 and 46, respectively, a channel region 50 disposed therebetween, and a polysilicon floating gate 52. The NMOS access transistor 54 includes an N-type source region 56, an N-type drain region 58, a channel region 62 disposed therebetween and a polysilicon gate 64.

Both the N-type drain region 58 and the P-type semiconductor material 72 are electrically connected to GND/Vss. The P-type semiconductor material 72 is connected to GND/Vss via a P-type contact region 76. The N-type source region 56 of the NMOS access transistor 54 is electrically connected to the P-type drain region 46 of the PMOS storage transistor 42 via a metal interconnect line 66 (a metal "strap"). Electrical isolation region 78 (e.g., a field oxide isolation region or a trench isolation region) provides isolation between PMOS storage transistor 42 and the NMOS access transistor 54.

Frequently, the conventional non-volatile memory devices 10 (see FIG. 1) are configured in a conventional non-volatile memory array 80, as illustrated in FIG. 4. Non-volatile memory array 80 includes a plurality of traversing bit lines 82 and word lines 84, each of which can be electrically connected to $V_{CC}/V_{SS}$. In non-volatile memory array 80, each of the non-volatile memory devices 10 is electrically connected to a bit line 82 and a word line 84. The polysilicon gates 20 of the NMOS access transistors 14 are each electrically connected to a word line 84. The source 18 of the PMOS storage transistors 12 are each electrically connected to a bit line 82. When a word line 84 is at $V_{SS}$, the electrically connected NMOS access transistors 14 are in an OFF state and no programming of the PMOS storage transistor can take place. However, when a word line 84 is at $V_{CC}$, the electrically connected NMOS access transistors 14 are in an ON state and programming of the PMOS storage transistor can take place depending on the state ($V_{CC}$ or $V_{SS}$) of the bit line.

For a further discussion of known non-volatile memory devices and known non-volatile memory arrays, see U.S. Pat. No. 6,055,185 to Kalnitsky et al. and Bergemont et al. supra, both of which are hereby incorporated by reference as if fully set forth.

A drawback of conventional non-volatile memory device 10 is its relatively large size. This relatively large size is due primarily to the need to connect the P-type drain of the PMOS storage transistor to the N-type source of the NMOS access transistor via a metal interconnect line. The relatively large size is also due, however, to a required spacing between the N-type source region of the NMOS access transistor and the N-type well region, in which the PMOS storage transistor is formed.

Still needed in the field, therefore, is a compact non-volatile memory device and memory array. In addition, the compact non-volatile memory device should be compatible with conventional MOS device processing.

SUMMARY OF THE INVENTION

The present invention provides a compact non-volatile memory device and a compact non-volatile memory array that can be fabricated using processes that are fully compatible with conventional MOS device processing. Therefore, compact non-volatile memory devices and compact non-volatile memory arrays according to the present invention can be easily embedded in MOS logic circuits, MOS mixed-signal circuits and MOS ASIC circuits.

Compact non-volatile memory devices according to the present invention include a PMOS storage transistor with a floating gate and a PMOS access transistor with a gate. Furthermore, the PMOS storage transistor and PMOS access transistor are electrically connected in series. Since both the PMOS storage transistor and the PMOS access transistor can be disposed in a single N-type well region, the size of the compact non-volatile memory devices is relatively small in comparison to conventional non-volatile memory devices.

Also provided by the present invention is a compact non-volatile memory device formed in a semiconductor substrate (e.g., a semiconductor wafer or a well region) of a first conductivity type (typically P-type). The compact non-volatile memory device includes a well region of a second conductivity type (typically N-type) disposed in the semiconductor substrate. Also included in the compact non-volatile memory device are a first source region of the first conductivity type, a first drain region of the first conductivity type, a first channel region defined therebetween, and a floating gate formed over the first channel region. Each of the first source region, first drain region and first channel region is formed in the well region.

The compact nonvolatile memory device also includes a second source region of the first conductivity type, a second drain region of the first conductivity type, a second channel region defined therebetween, and a gate formed over the second channel region. Each of the second source region, second drain region and second channel region is formed in the well region.

Since the first and second source regions, first and second drain regions, and first and second channel regions are all formed in a single well region, compact non-volatile memory devices according to the present invention are of a relatively small size.

A compact non-volatile memory array according to the present invention is also provided and includes a plurality of traversing (e.g., crisscrossing) bit lines and word lines and a plurality of compact non-volatile memory devices.

Each of the compact non-volatile memory devices includes a PMOS storage transistor with a floating gate and a source and a PMOS access transistor with a gate. The PMOS access transistor is connected in series with the PMOS storage transistor. In addition, each of the compact non-volatile memory devices is electrically connected to one of the bit lines via the source of the PMOS access transistor and electrically connected to one of the word lines via the gate of the PMOS access transistor.

BRIEF DESCRIPTION OF THE DRAWINGS

A better understanding of the features and advantages of the present invention will be obtained by reference to the following detailed description that sea forth illustrative embodiments, in which the principles of the invention are utilized, and the accompanying drawings, of which.

DETAILED DESCRIPTION OF THE INVENTION

Figure 5:
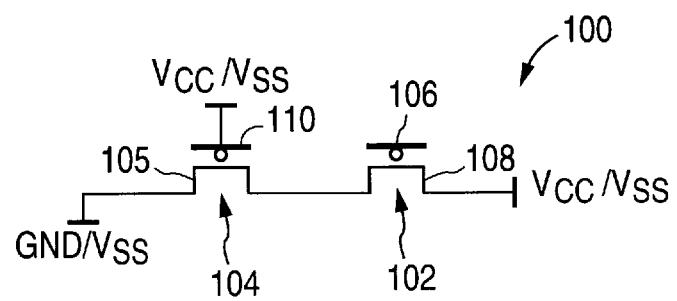
FIG. 5 is an electrical schematic representation of a compact non-volatile memory device according to the present invention.

FIG. 5 is an electrical schematic depicting a compact non-volatile memory device 100 according to the present invention. Compact non-volatile memory device 100 includes a PMOS storage transistor 102 and a PMOS access transistor 104 that are electrically connected in series. The PMOS storage transistor 102 includes a polysilicon floating gate 106 and a source 108 electrically connected to $V_{CC}/V_{SS}$ (e.g., by being electrically connected to a bit line). The PMOS access transistor 104 includes a polysilicon gate 110 that is electrically connected to $V_{CC}/V_{SS}$ (e.g., by being electrically connected to a word line). PMOS access transistor 104 also includes a drain 105 that is electrically connected to $GND/V_{SS}$.

Since both the PMOS access transistor 104 and the PMOS storage transistor 102 are P-type devices, they can be formed in a single N-well (not shown in FIG. 5 but illustrated, for example, in FIGS. 6 and 7 discussed below), thereby providing a relatively compact non-volatile memory device. In other words, in compact non-volatile memory devices according to the present invention, there is no need for (i) the conventional metal interconnect line between a storage transistor and a access transistor nor (ii) the conventionally required spacing between an N-type source region of an access transistor and an N-type well region. Therefore, the typical size of compact non-volatile memory devices according to the present invention is, for example, approximately 50% smaller than the size of conventional non-volatile memory devices.

When the polysilicon gate 110 of the PMOS access transistor 104 is at $V_{CC}$ (e.g., if it is electrically connected to a word line at $V_{CC}$; $V_{CC}$ also referred to as $V_{DD}$ or the power supply voltage), the PMOS access transistor 104 is in an OFF state. However, when the polysilicon gate 110 of the PMOS access transistor 104 is at $V_{SS}$ (e.g., if it is electrically connected to a word line at $V_{SS}$), the PMOS access transistor 104 is in an ON state.

If the source 108 of the PMOS storage transistor 102 is at $V_{CC}$ (e.g., if it is electrically connected to a word line at $V_{CC}$) when the PMOS access transistor 104 is in an ON state, a source-drain potential bias is provided on the PMOS storage transistor 102. This source-drain potential bias is sufficient to result in a charging of the polysilicon floating gate 106. This charging is due to a combination of charge injection and capacitive coupling between the source 108 of the PMOS storage transistor 102 and the polysilicon floating gate 106. The charging of the polysilicon floating gate 106 places the PMOS storage 102 in a "high" state.

If, on the other hand, the source 108 of the PMOS storage transistor 102 is at $V_{SS}$ (e.g., if it is electrically connected to a word line at $V_{SS}$) when the PMOS access transistor 104 is ON, the source-drain potential bias on the PMOS storage transistor 102 is insufficient to result in charging of the polysilicon floating gate 106. When no charge is on the polysilicon floating gate 106, the PMOS storage transistor 102 is in a "low" state. Since the PMOS storage transistor 102 has two charged states (i.e., low and high), it can be used to store digital data.

Figure 6:
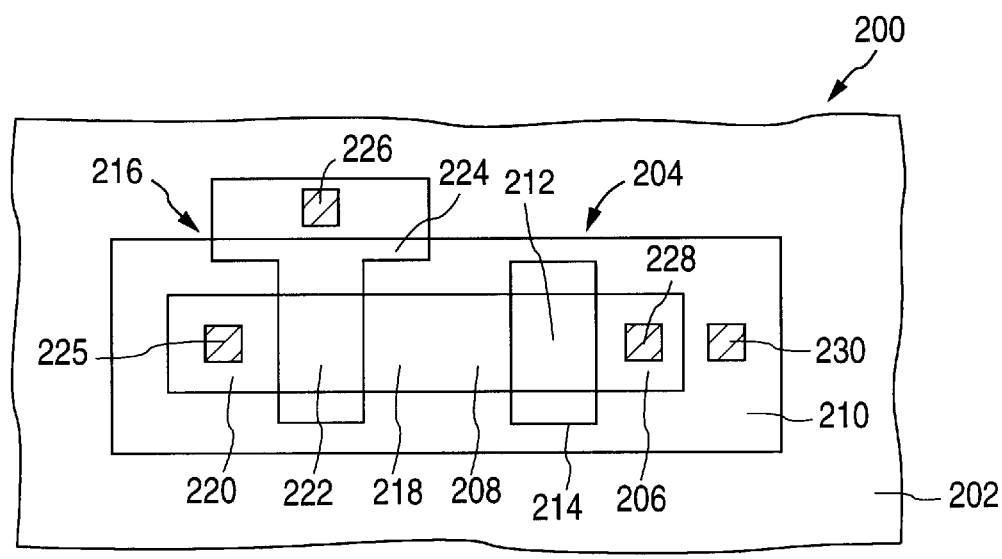
FIG. 6 is plan view of another compact non-volatile memory device according to the present invention.

FIG. 6 illustrates, in a plan view, another compact non-volatile memory device 200 according to the present invention. Compact non-volatile memory device 200 is formed in a P-type substrate 202 and includes a PMOS storage transistor 204 that includes spaced-apart P-type source region 206 and P-type drain region 208. The P-type source region 206 and P-type drain region 208 are formed in an N-type well region 210, and a first channel region 212 is defined between the P-type source region 206 and the P-type drain region 208. PMOS storage transistor 202 also includes a polysilicon floating gate 214.

Compact non-volatile memory device 200 also includes a PMOS access transistor 216 that includes spaced-apart P-type source and drain regions 218 and 220, respectively. The P-type source region 218 and P-type drain region 220 are formed in N-type well region 210. A channel region 222 is defined between the P-type source region 218 and the P-type drain region 220. PMOS access transistor 216 also includes a polysilicon gate 224.

Compact non-volatile memory device 200 also includes a first contact region 225 for electrically connecting the P-type drain region 220 to GND/ $V_{SS}$, a second contact region 226 for connecting the polysilicon gate 224 to $V_{CC/VSS}$, a third contact region 228 for connecting the P-type source region 206 to $V_{CC}/V_{SS}$ and a fourth contact region 230 for connecting the N-type well region 210 to $V_{CC}/V_{SS}$. Third and fourth contact regions 228 and 230, respectively, are configured such that their connection to $V_{SS}$ or $V_{CC}$ occurs in a coordinated manner.

Figure 7:
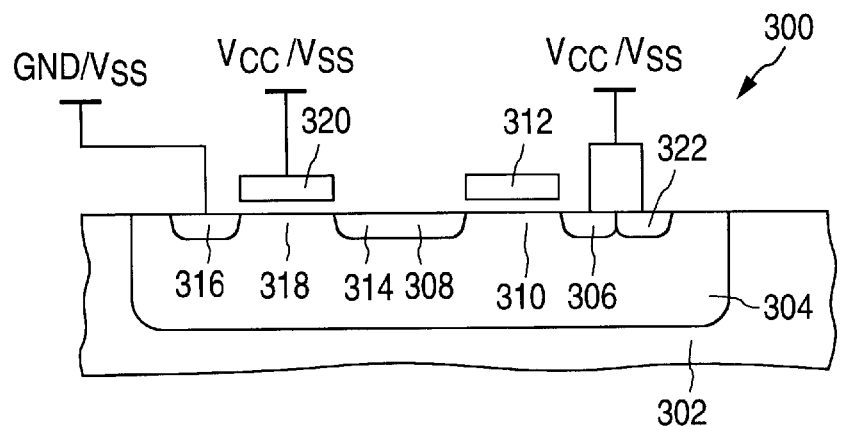
FIG. 7 is a combined cross-sectional and schematic side view of yet another compact non-volatile memory device according to the present invention that is essentially equivalent to the compact non-volatile memory device of FIG. 6.

FIG. 7 illustrates, in a combined cross-sectional and schematic format, yet another compact non-volatile memory device 300 according to the present invention. One skilled in the art will recognize that compact non-volatile memory device 300 is essentially a combined cross-sectional and schematic representation of the compact non-volatile memory device of FIG. 6. Compact non-volatile memory device 300 is formed in a P-type semiconductor substrate 302 (e.g., a P-type wafer substrate or a P-type well region) and includes a single N-type well region 304 disposed in the P-type semiconductor substrate 302.

Compact non-volatile memory device 300 also includes a first P-type source region 306 formed in the N-type well region 304 and a first P-type drain region 308 formed in the N-type well region 304. The compact non-volatile memory device 300 also includes a first channel region 310 defined between the first P-type source region 306 and first P-type drain region 308. In addition, a polysilicon floating gate 312 is formed over the first channel region 310.

Compact non-volatile memory device 300 also includes a second P-type source region 314 and a second P-type drain region 316, both of which are formed in the N-type well region 304. As illustrated in FIG. 7, the second P-type source region 314 and the first P-type drain region 308 are merged into a single shared P-type region (i.e., they share a contiguous P-type region). The compact non-volatile memory device 300 also includes a second channel region 318 defined between the second P-type source region 314 and the second P-type drain region 316. In addition, a polysilicon gate 320 is formed over the second channel region 318 and configured to be electrically connected to $V_{CC}/V_{SS}$. Compact non-volatile memory device 300 also includes an N-type contact region 322.

It is evident from a review of FIGS. 5–7 that the first P-type source region 306, the first P-type drain region 308, the first channel region 310 and polysilicon floating gate 312 are elements of a PMOS storage transistor and that the second P-type source region 314, the second P-type drain region 316, the second channel region 318 and the polysilicon gate 320 are elements of a PMOS access transistor.

It is contemplated that compact non-volatile memory devices according to the present invention can be employed as a One-Time Programmable (OTP) memory device. In this regard, the term "OTP memory device" refers to a memory device that can be programmed (by applying a sufficient source-drain potential bias to the PMOS storage transistor), but can not be electrically erased. Such an OTP memory device can, however, be erased through UV exposure. It is further contemplated that compact non-volatile memory devices according to the present invention will be useful as a compact non-volatile memory device in capacitor trimming circuits, resistor trimming circuits and circuits configured to provide memory redundancy.

Figure 1:
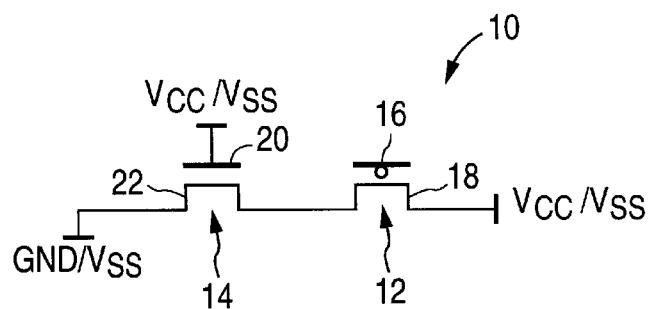
FIG. 1 is an electrical schematic representation of a conventional non-volatile memory device.
Figure 2:
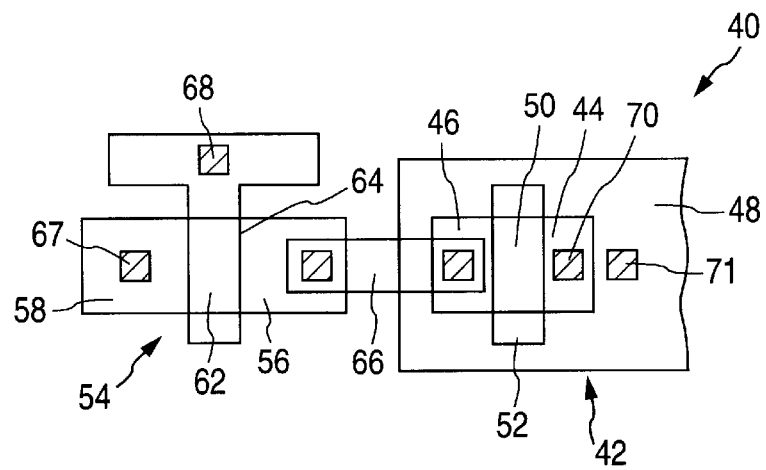
FIG. 2 depicts a plan view of a conventional non-volatile memory device that is essentially equivalent to the conventional non-volatile memory device of FIG. 1.
Figure 3:
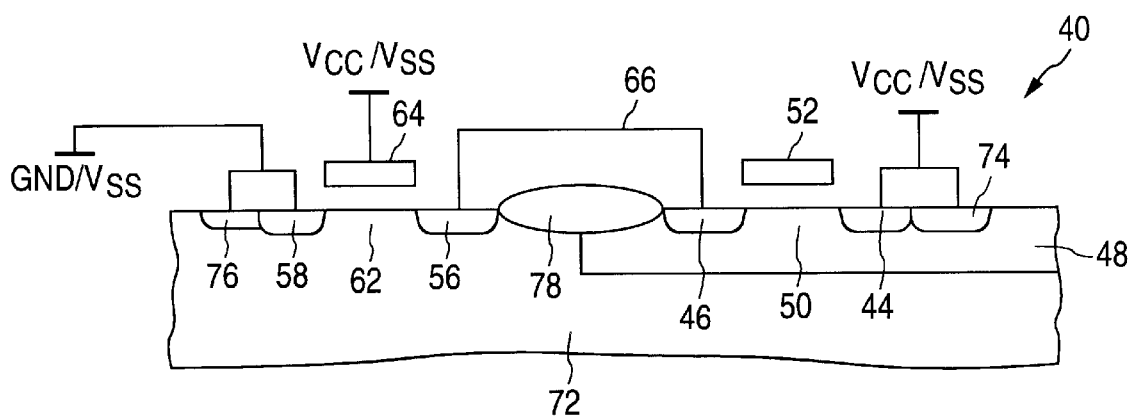
FIG. 3 is a combined cross-sectional and schematic side view depicting the conventional non-volatile memory device of FIG. 2.
Figure 4:
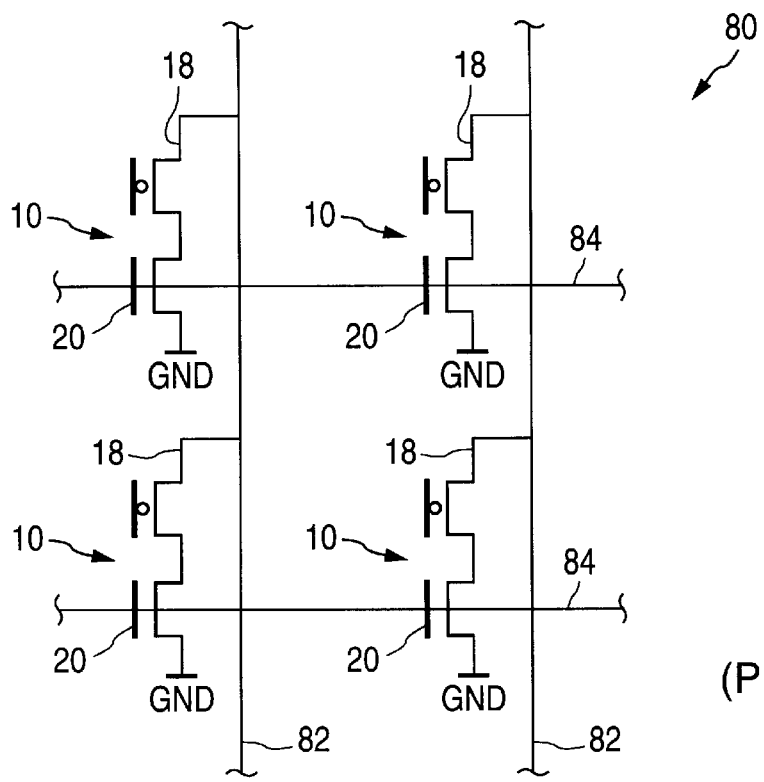
FIG. 4 is an electrical schematic representation of a conventional non-volatile memory array utilizing the conventional non-volatile memory device of FIG. 1.
Figure 8:
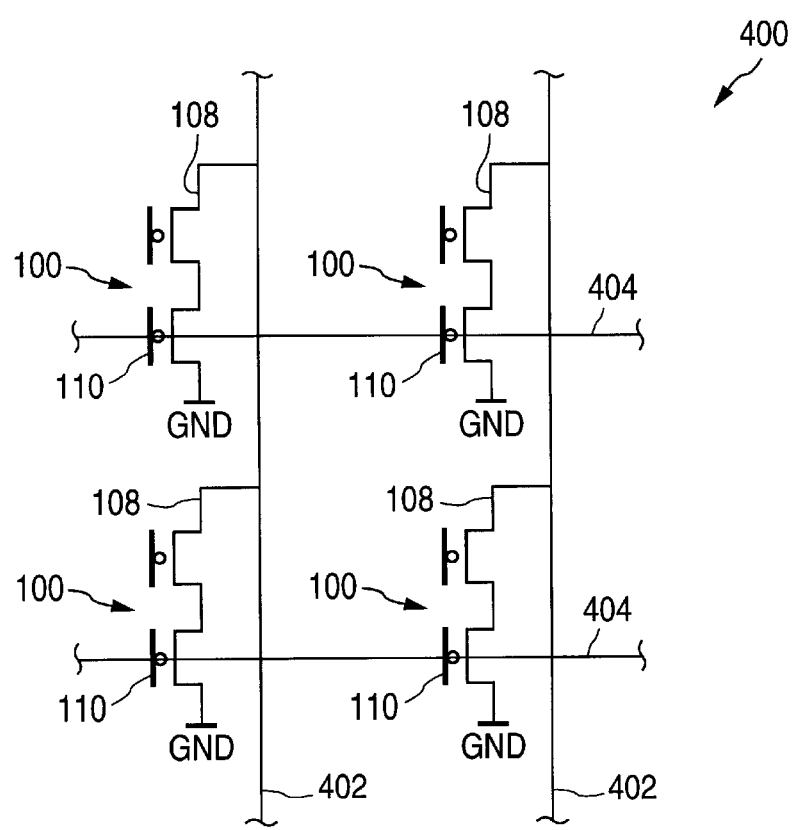
FIG. 8 is an electrical schematic representation of a compact non-volatile memory array according to the present invention that includes a plurality of the compact non-volatile memory devices of FIG. 5.

FIG. 8 illustrates a compact non-volatile memory array 400 according to the present invention that includes a plurality of compact non-volatile memory devices 100 previously described with respect to FIG. 5. Compact non-volatile memory array 400 also includes a plurality of traversing (i.e., crisscrossing) bit lines 402 and word lines 404.

Each compact non-volatile memory device 100 of FIG. 8 is electrically connected to one of the bit lines 402 via the source 108 of its PMOS storage transistor 102. In addition, each compact non-volatile memory device 100 is electrically connected to one of the word lines 404 via the polysilicon gate 110 of the PMOS access transistor 104.

The compact non-volatile memory devices 100 of FIG. 8 can be programmed (i.e., placed into a "high" state) by placing $V_{SS}$ on its electrically connected bit line and $V_{CC}$ on its electrically connected word line. If, on the other hand, $V_{SS}$ is placed on its word line, the compact non-volatile memory device 100 will not be programmed.

Compact non-volatile memory devices and compact non-volatile memory arrays according to the present invention can be manufactured using processes that are compatible with standard MOS processing without any additional processing steps. For example, the present compact non-volatile memory device and compact non-volatile memory arrays can be manufactured using only a single polysilicon layer as a precursor to both the polysilicon floating gate of the PMOS storage transistor and the polysilicon gate of the PMOS access transistor, in which case both the polysilicon floating gate and the polysilicon gate will lie essentially in the same plane.

The compact non-volatile memory device of the present invention can be used in a number of applications. For example, the compact non-volatile memory device can be configured as an element of a capacitor trimming circuit, and as an element of a resistor trimming circuit. In addition, the compact non-volatile memory device can also be configured as an element of a memory redundancy circuit.

It should be understood that various alternatives to the embodiments of the invention described herein may be employed in practicing the invention. It is intended that the following claims define the scope of the invention and that structures within the scope of these claims and their equivalents be covered thereby.

What is claimed is:

1. A memory device formed in a semiconductor substrate of a first conductivity type, the memory device comprising:
    a well region of a second conductivity type disposed in the semiconductor substrate;
    a first source region of the first conductivity type formed in the well region, the first source region being electrically connected to the well region via an interconnect;
    a first drain region of the first conductivity type formed in the well region;
    a first channel region defined between the first source region and the first drain region;
    a floating gate formed over the first channel region;
    a second source region of the first conductivity type formed in the well region;
    a second drain region of the first conductivity type formed in the well region;
    a second channel region defined between the second source region and the second drain region;
    a gate formed over the second channel region.

2. The compact non-volatile memory device of claim 1 wherein the floating gate is a polysilicon floating gate and the gate is a polysilicon gate.

3. The compact non-volatile memory device of claim 1 wherein the floating gate and the gate lie essentially in the same plane.

4. The compact non-volatile memory device of claim 2 wherein the polysilicon gate is configured to be electrically connected to $V_{CC}$ and $V_{SS}$, the first source region is configured to be electrically connected to $V_{CC}$ and $V_{SS}$, and the second drain region is configured to be electrically connected to GND/$V_{SS}$.

5. The compact non-volatile memory device of claim 1 wherein the first drain region and the second source region are merged into a contiguous region.

6. The compact non-volatile memory device of claim 1 configured as an element of a memory array.

7. The compact non-volatile memory device of claim 1 wherein the second conductivity type is N-type.

8. The compact non-volatile memory device of claim 1 configured as a One-Time Programmable (OTP) memory device.

9. The compact non-volatile memory device of claim 1 configured as an element of a capacitor trimming circuit.

10. The compact non-volatile memory device of claim 1 configured as an element of a resistor trimming circuit.

11. The compact non-volatile memory device of claim 1 configured as an element of a memory redundancy circuit.

12. A memory device formed in a semiconductor substrate of a first conductivity type, the memory device comprising:
    a well region of a second conductivity type disposed in the semiconductor substrate;
    a first source region of the first conductivity type formed in the well region;
    a first drain region of the first conductivity type formed in the well region;
    a first channel region defined between the first source region and the first drain region;
    a floating gate formed over the first channel region, the floating gate not being formed over any region that has the second conductivity type and a dopant concentration greater than a dopant concentration of the well region;
    a second source region of the first conductivity type formed in the well region;
    a second drain region of the first conductivity type formed in the well region;
    a second channel region defined between the second source region and the second drain region.
    a gate formed over the second channel region.

13. The memory device of claim 12 wherein the first source region is electrically connected to the well region.

14. The memory device of claim 13 wherein the first drain region and the second source region are merged into a contiguous region.

15. The memory device of claim 13 wherein the floating gate is totally electrically isolated.

16. A memory array comprising:
    a plurality of memory devices arranged in rows and columns, each memory device being formed in a semiconductor substrate of a first conductivity type, and comprising:
        a well region of a second conductivity type disposed in the semiconductor substrate;
        a first source region of the first conductivity type formed in the well region;
        a first drain region of the first conductivity type formed in the well region;
        a first channel region defined between the first source region and the first drain region;
        a floating gate formed over the first channel region, the floating gate not being formed over any region that has the second conductivity type and a dopant concentration greater than a dopant concentration of the well region;
        a second source region of the first conductivity type formed in the well region;
        a second drain region of the first conductivity type formed in the well region;
        a second channel region defined between the second source region and the second drain region; and a gate formed over the second channel region;

a plurality of word lines, each word line being connected to each gate in a row of memory devices; and a plurality of bit lines, each bit line being connected to each first source region in a column of memory devices.

17. The memory array of claim 16 wherein the first source region is electrically connected to the well region.

18. The memory array of claim 17 wherein the first drain region and the second source region are merged into a contiguous region.

19. The memory array of claim 17 wherein the floating gate is totally electrically isolated.

20. A memory array comprising:

a plurality of memory devices arranged in rows and columns, each memory device being formed in a semiconductor substrate of a first conductivity type, and comprising:

a well region of a second conductivity type disposed in the semiconductor substrate;

first source a first source region of the first conductivity type formed in the well region, the first source region being electrically connected to the well region via an interconnect;

a first drain region of the first conductivity type formed in the well region;

a first channel region defined between the first source region and the first drain region;

a floating gate formed over the first channel region;

a second source region of the first conductivity type formed in the well region;

a second drain region of the first conductivity type formed in the well region;

a second channel region defined between the second source region and the second drain region; and a gate formed over the second channel region;

a plurality of word lines, each word line being connected to each gate in a row of memory devices; and a plurality of bit lines, each bit line being connected to each first source region in a column of memory devices.

* * * * *

UNITED STATES PATENT AND TRADEMARK OFFICE
CERTIFICATE OF CORRECTION

PATENT NO. : 6,414,872 B1
DATED : July 2, 2002
INVENTOR(S) : Bergemont et al.

It is certified that error appears in the above-identified patent and that said Letters Patent is hereby corrected as shown below:

Title page,
Item [56], References Cited, OTHER PUBLICATIONS, delete "compatibility" and replace with -- compatibility --.

Column 8,
Line 35, delete "." and replace with -- ; --.

Column 9,
Line 21, delete the first occurrence of "first source".

Signed and Sealed this

Nineteenth Day of November, 2002

Attest:

JAMES E. ROGAN
Attesting Officer
Director of the United States Patent and Trademark Office